(12) United States Patent
Choquette et al.

(10) Patent No.: US 7,625,471 B2
(45) Date of Patent: *Dec. 1, 2009

(54) SACRIFICIAL CATHODE TARGET FOR SPUTTERING CATHODE ASSEMBLY

(75) Inventors: Robert Choquette, Sarasota, FL (US); Patrick Manley, Longmont, CO (US)

(73) Assignee: Mustang Vacuum Systems, LLC, Sarasota, FL (US)

( * ) Notice: Subject to any disclaimer, the term of this patent is extended or adjusted under 35 U.S.C. 154(b) by 804 days.

This patent is subject to a terminal disclaimer.

(21) Appl. No.: 11/334,182

(22) Filed: Jan. 17, 2006

(65) Prior Publication Data
US 2006/0201803 A1 Sep. 14, 2006

Related U.S. Application Data

(62) Division of application No. 11/076,664, filed on Mar. 10, 2005, now Pat. No. 7,087,145.

(51) Int. Cl.
*C23C 14/35* (2006.01)
(52) U.S. Cl. .......................... 204/298.09; 204/298.12; 204/298.19

(58) Field of Classification Search ............ 204/298.09, 204/298.12, 298.13, 298.17, 298.19
See application file for complete search history.

(56) References Cited

U.S. PATENT DOCUMENTS 7,087,145 B1 * 8/2006 Choquette et al. ...... 204/298.09

* cited by examiner

*Primary Examiner*—Rodney G McDonald
(74) *Attorney, Agent, or Firm*—Clare Smith Long; Corsaro & Associates, Co., LPA

(57) ABSTRACT

A sputtering cathode assembly attachable to a cathode mounting plate for a thin-film vapor deposition chamber. The cathode assembly includes a magnet module and a cathode body generally coextensive with and sealingly housing the magnet module and defining a water channel between a top plate of the cathode body and a cooling channel plate of the magnet module. An elongated target is releasably connected atop and coextensive with the top plate and secured in place by a unique threaded fastener engagement between a target clamp and an edge portion of the cathode body whereby the target is replaceable without disassembly of the cathode body. Unique replaceable elongated fastener receiving inserts releasably secure said target against the target plate to effect target replacement without disassembly of the cathode body.

3 Claims, 12 Drawing Sheets

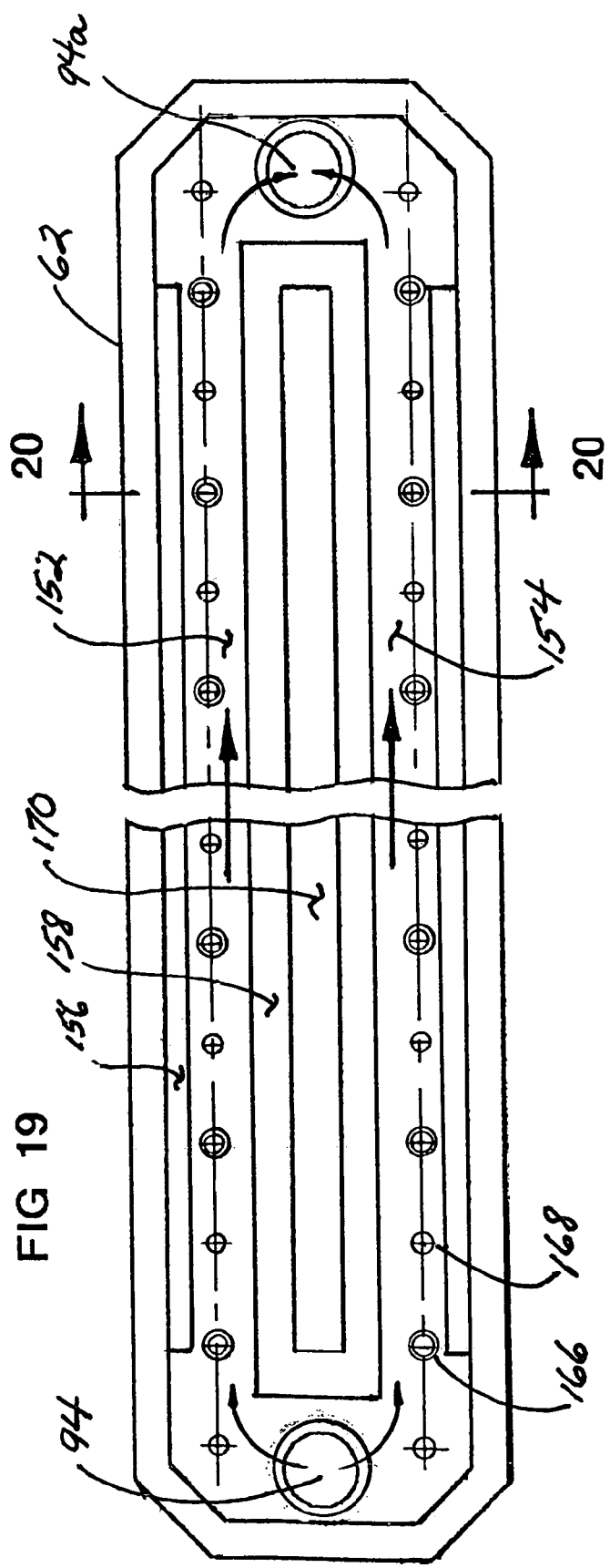
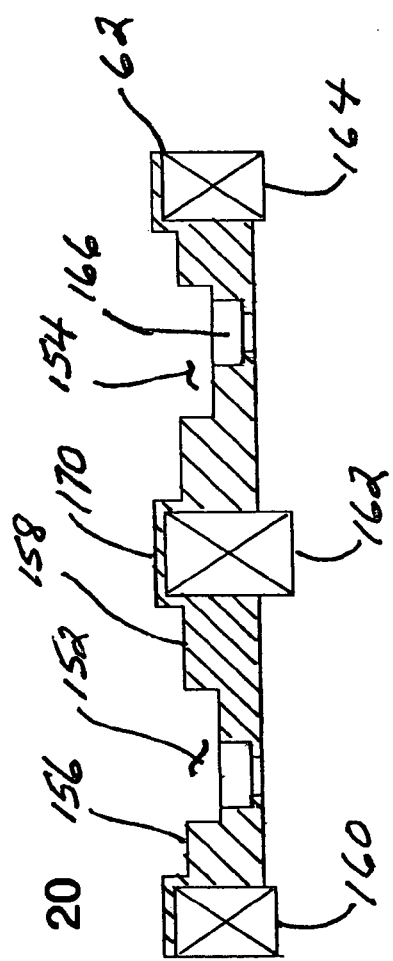
FIG 19
FIG 20

SACRIFICIAL CATHODE TARGET FOR SPUTTERING CATHODE ASSEMBLY

CROSS-REFERENCE TO RELATED APPLICATIONS

This application is a DIV of Ser. No. 11/076,664 filed Mar. 10, 2005 now U.S. Pat. No. 7,087,145.

STATEMENT REGARDING FEDERALLY SPONSORED RESEARCH OR DEVELOPMENT

Not applicable

INCORPORATION-BY-REFERENCE OF MATERIAL SUBMITTED ON A COMPACT DISC

Not applicable

BACKGROUND OF THE INVENTION

1. Field of the Invention

This invention relates generally to systems for coating objects by sputtering deposition, and more particularly to an improved sacrificial cathode target for a sputtering cathode assembly having features which greatly improve the duration of useful or working time afforded before the target material must be replaced.

2. Description of Related Art

The sputtering deposition of materials onto objects to be coated with the sputtered material is well known and includes the process of material removal from a target material by its bombardment with highly energized ions formed after high energy electrons are emitted from the target material by placing a high RF or d.c. voltage between the target and the objects to be coated. These emitted electrons ionize processed gas such as argon placed within a vacuum chamber after it has been substantially evacuated of air up to 100 m Torr vacuum pressure.

The processed gas ions then form a plasma, an electrically neutral association of electrons and positive ions. The plasma is caused by the emitting of electrons from the target material. The plasma ions accelerate and strike the target causing atoms to be ejected from the target material which is then deposited onto the objects having previously been placed within the vacuum chamber.

Ideally, the duty cycle of each fresh target of each cathode assembly should last until a significant portion, i.e. 40% to 45% of the target has been deposited onto objects within the vacuum chamber. However, the duty cycle of the target attached to the cathode assembly is so severe that physical deformities in the target and the supporting structure associated with the cathode assembly rapidly deteriorate, requiring premature replacement of the target material. The expense of reconditioning each cathode assembly, including the target material, is substantial both with respect to maintenance, replacement components and system downtime.

Commercially available sputtering cathode assemblies have a threaded hole or use a HELICOIL E-Z LOK as a threaded insert to attach target clamps against the edge of the target positioned directly atop a copper body or top plate of the cathode assembly. Typically within only hours of operation, the target bolts begin to loosen, the HELICOILS become damaged or the bolt is simply sheered off. When the target must be changed, most of the HELICOILS require replacement or the threaded inserts seize and require replacement, usually causing damage to the copper top plate itself. Special tools are required to disassemble and remove damaged HELICOILS and, if damage to the top plate is sufficiently severe, it must be totally replaced.

Sputtering cathode assemblies require that the target and the cathode body be cooled by water to prevent meltdown or damage to the sputtering magnets contained within the magnet module positioned adjacent the top copper plate. To seal off the water cavity, commercially available cathode assemblies must have the target clamped tightly to the cathode body, leaving little or no room for the target to expand. At low duty cycles of low power density, this issue is not sufficiently severe to represent a reduction in duty cycle. However, at higher power densities, the duty cycle is substantially reduced.

There are two ways that a target may be cooled: (a) by direct cooling wherein the back of the target is used to seal the water jacket or (b) indirect cooling utilizing a thin copper top plate or backing plate against which the target is directly clamped. Even with the indirect technique or method, the target is still required to be tightly clamped to the thin backing plate to prevent leakage of water from the water passageway. Thicker backing plates which are sufficiently strong to withstand warpage during high power input levels interfere with heat transfer and reduces target thickness through the thicker top plate causing excess thermal expansion of the target due to overheating. At low power densities of less than 200 watts/in$^2$ are viable under these cooling techniques. However, in applications that require cathodes to work under a duty cycle of densities of 300 watts/in$^2$ or higher, thermal expansion of the target during the duty cycle causes the target clamps to loosen, leading to water leakage. The tightening of target clamps after this occurs is usually not sufficiently remedial to stop water leakage as the target itself is typically warped as well from the thermal duty cycle.

Under these adverse conditions, commercially available targets will only last about 24 hours at higher power levels whereas, the target contains sufficient material for vacuum deposit which could last at least ten working days otherwise.

Commercially available cathode assemblies use either a silver braised water tube or a female pipe tube threaded into the back or base plate of the cathode body. The silver braised water tube over time and misuse in handling can break and require a costly replacement. The threaded female pipe thread over time will also weaken, causing permanent damage and requiring costly replacement of the entire cathode body base plate.

The present invention addresses and substantially improves upon all of the above-described shortcomings currently being experienced by the operator of sputtering deposition systems to greatly increase the longevity of the duty cycle afforded by each fresh sputtering cathode assembly containing a fresh target. Not only is the operative duty cycle extended, but the reconditioning or refurbishing of each cathode assembly when replacing the mostly expended target is greatly facilitated and requiring substantially less time and replacement costs associated therewith.

BRIEF SUMMARY OF THE INVENTION

This invention is directed to a sputtering cathode assembly attachable to a cathode mounting plate for a thin-film vapor deposition chamber. The cathode assembly includes a magnet module and a cathode body generally coextensive with and sealingly housing the magnet module and defining a water channel between a top plate of the cathode body and a cooling channel plate of the magnet module. An elongated target is releasably connected atop and coextensive with the top plate and secured in place by threaded fastener engagement between a target clamp and an edge portion of the cathode body whereby the target is replaceable without disassembly of the cathode body. Unique replaceable elongated fastener receiving inserts releasably secure said target against the target plate to effect target replacement without disassembly of the cathode body.

It is therefore an object of this invention to provide a sputtering cathode assembly for use in a sputter coating vacuum deposition system which affords a greatly enhanced duty cycle before reconditioning and/or replacement is required.

Still another object of this invention is to provide a sputtering cathode assembly which will facilitate the vacuum vapor deposition of substantially all of the target material before replacement is required.

Yet another object of this invention is to provide a sputtering cathode assembly in which the target material may be easily removed and replaced without upsetting the sealed condition of the cooling water jacket.

The present invention further provides a new drop-in insert for securing the target which is easily replaceable and prevents damage to the cathode body base plate.

Still another object of this invention is to provide a split cathode body which does not require that the clamped target form a water seal with the water cavity itself so that the water is completely isolated from the vacuum chamber and the target is not required to be tightly clamped to seal the water cavity itself.

Yet another object of this invention is to provide a target and mating target clamp structure which controls the direction of thermal expansion of the target during the duty cycle to eliminate damage to the target clamps positioned at the ends of the target.

Still another object of this invention is to provide an O-ring sealed water inlet/outlet tube which is easily replaceable and which avoids damage caused to the cathode body itself when fatigue or failure of the water inlet/outlet tube might occur.

In accordance with these and other objects which will become apparent hereinafter, the instant invention will now be described with reference to the accompanying drawings.

BRIEF DESCRIPTION OF THE SEVERAL VIEWS OF THE DRAWING(S)

FIG. 19 is a top plan view of the magnet module.

FIG. 20 is a section view in the direction of arrows 20-20 in FIG. 19.

DETAILED DESCRIPTION OF THE INVENTION

Figure 1:
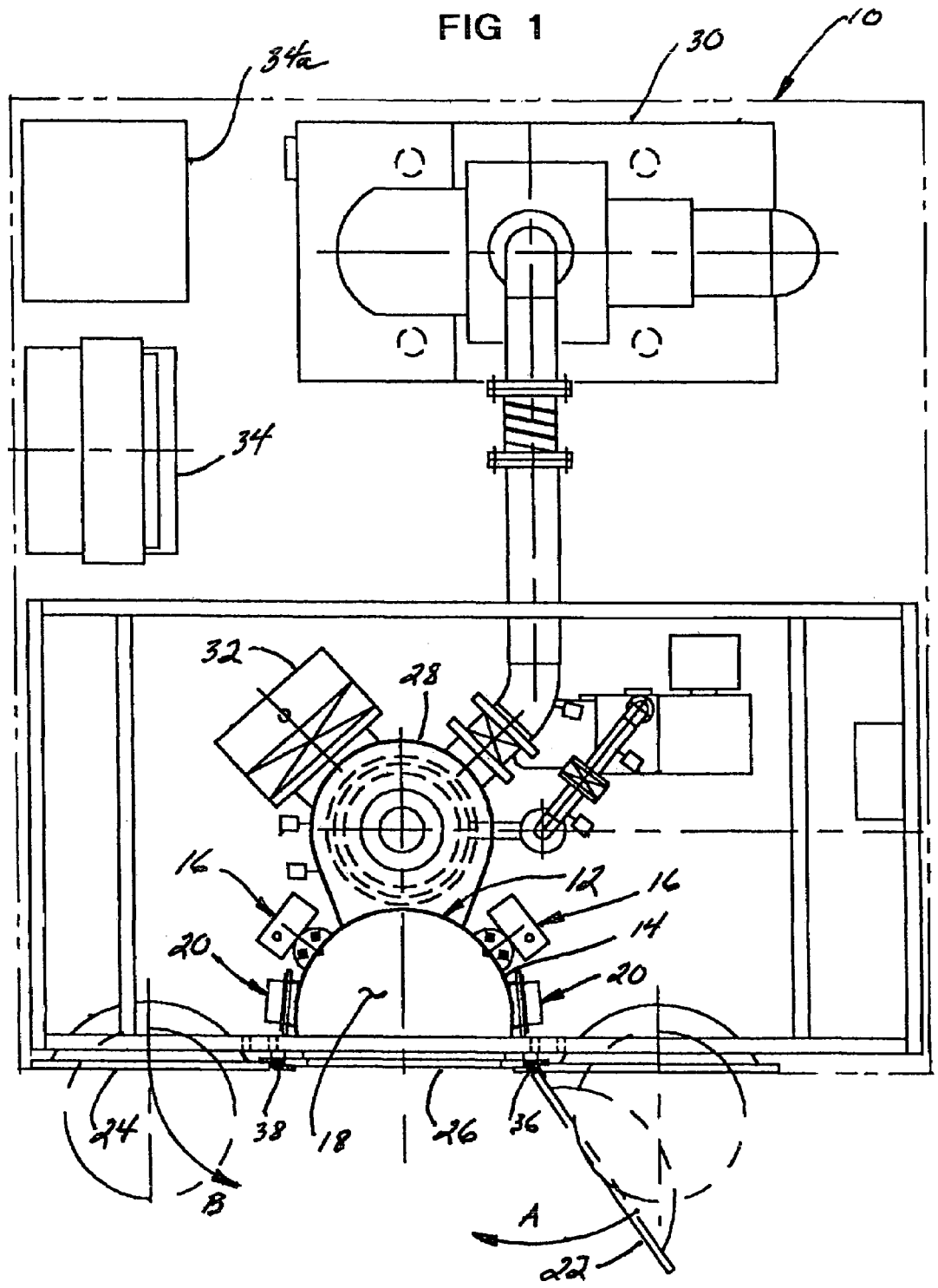
FIG. 1 is a top plan simplified schematic view of a sputter coating deposition system including the present invention.
Figure 2:
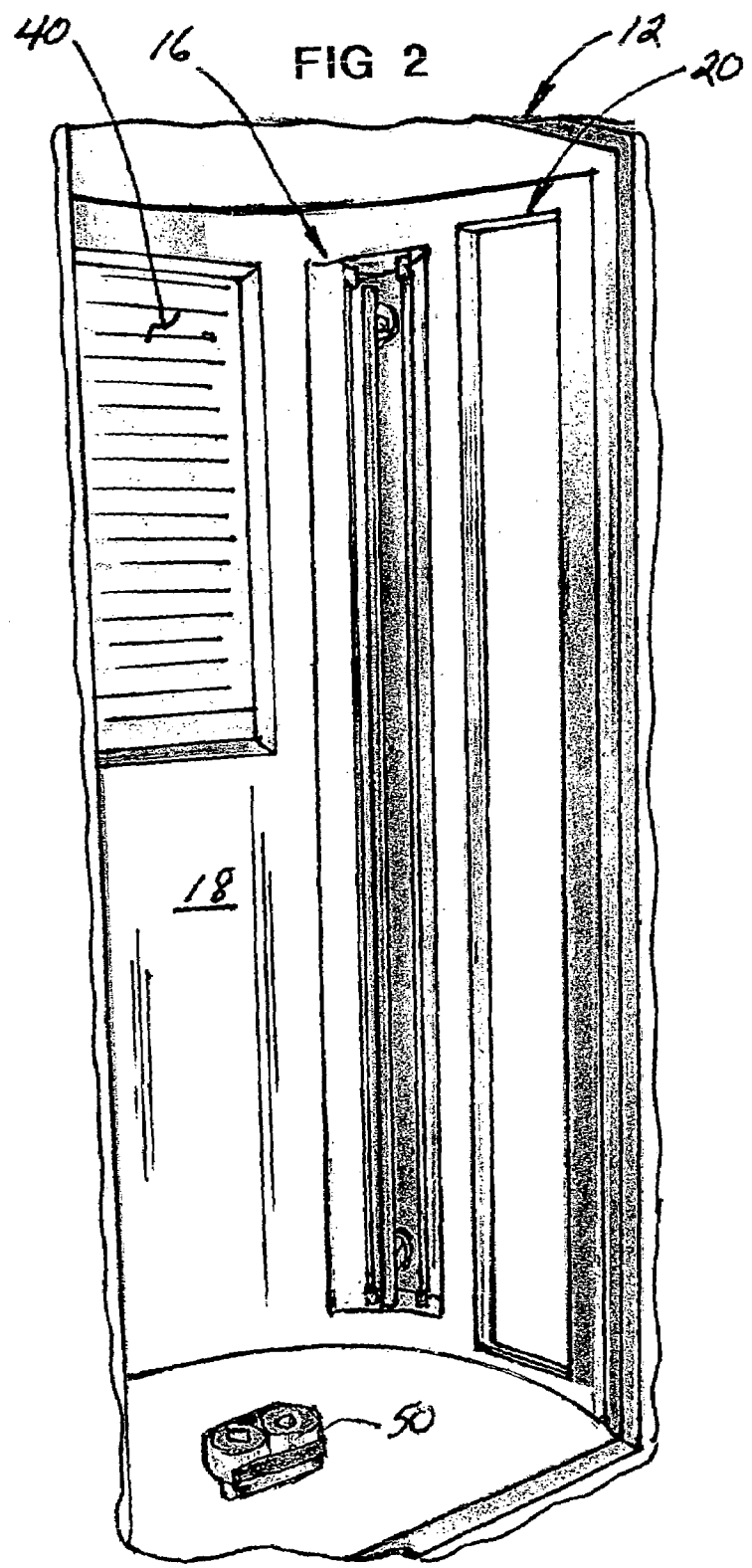
FIG. 2 is a broken perspective view of the interior of the vacuum deposition chamber showing the present invention.
Figure 3:
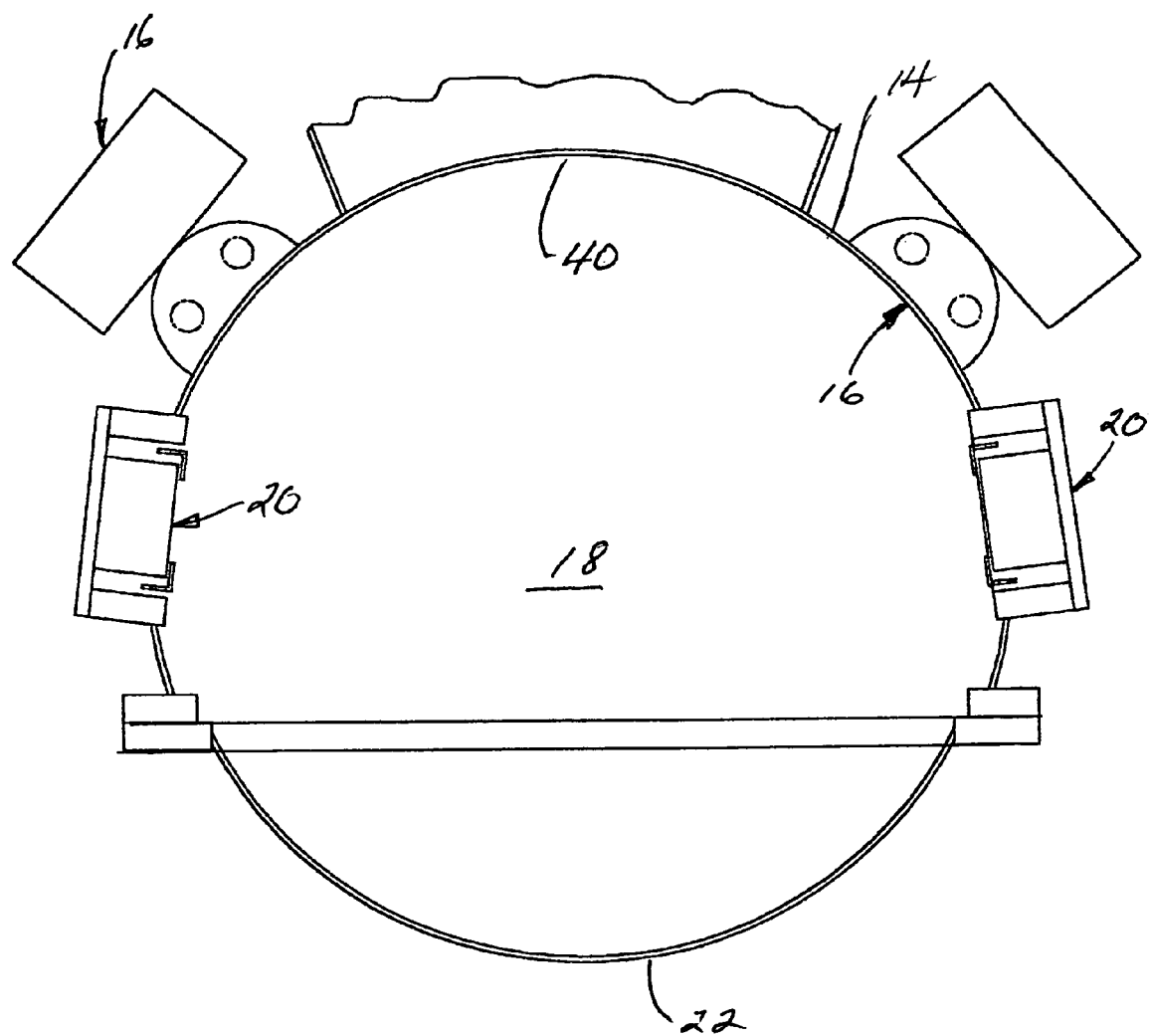
FIG. 3 is a simplified top plan schematic view of the vapor deposition chamber also showing the present invention.
Figure 4:
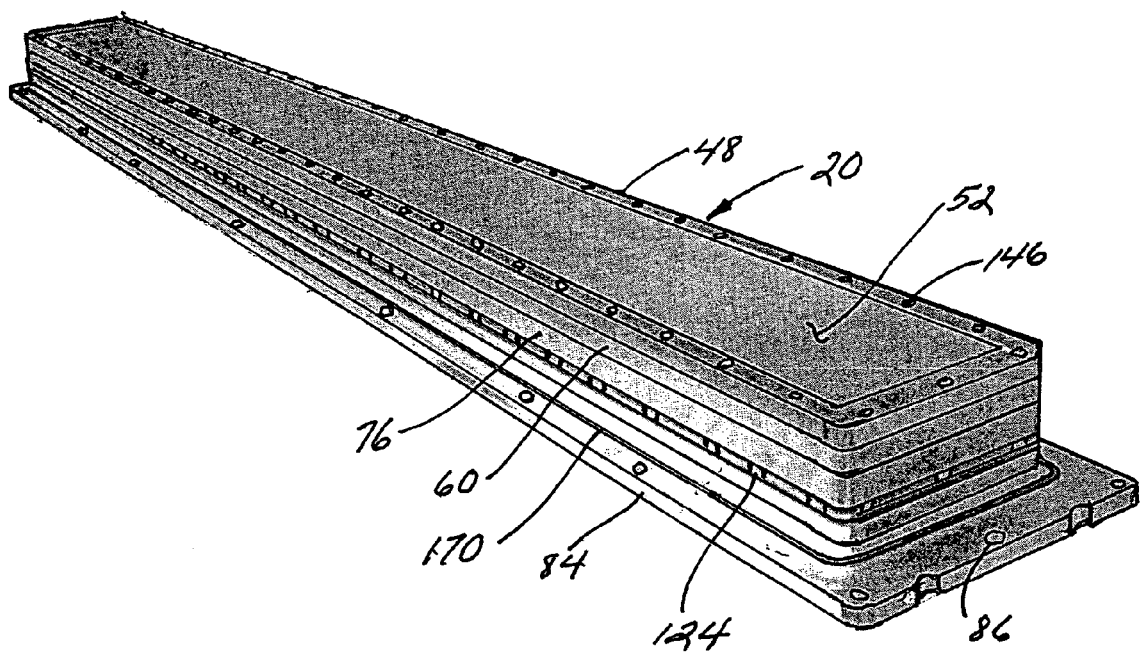
FIG. 4 is a perspective view of the present invention.

Referring now to the drawings, and initially to FIG. 1 to 3, a typical sputtering deposition system is shown generally at numeral 10 in FIG. 1 and includes a sputter coating apparatus 12 which generally includes a vacuum chamber 14 and two spaced oppositely facing longitudinally extending polymerization apparatus 16. The polymerization apparatus 16 are described in detail in U.S. Pat. No. 5,895,531 which is incorporated herein by reference.

The sputter coating apparatus 12 also includes two spaced oppositely facing sputtering cathode assemblies 20 which are positioned as best seen in FIGS. 1 and 3 adjacent to the opening 26 for door 22 or 24 of the vacuum chamber 14. Each of these sputtering cathode assemblies 20 is generally coextensive with the longitudinal axis of the elongated vacuum chamber 14 itself. The apparatus 12 further includes swingable or pivotably closable doors 22 and 24 which are hingedly connected about upright axes 36 and 38, respectively and, when individually closed, seal the interior 18 of the vacuum chamber 14.

The sputtering system 10 further includes a plenum 28 which facilitates the evacuation of air through grill 40 from the interior 18 of chamber 14 to draw the vacuum atmosphere within the chamber 18 down to in the range of 100 m Torr pressure level during each vacuum deposition cycle. A polypod 32 is operably connected to a refrigeration unit 34a. A rotary vein pump 30, interconnected with plenum 28, effects the depressurization the interior volume 18. Polymer reservoir 34, interconnected to the polymerization apparatus 16 adjacent thereto, transfers the polymerization material to each of the polymerization apparatus 16. A driving gear 50 at the bottom of the chamber 14 as seen in FIG. 2 causes an upright reel assembly with objects loaded thereon (not shown) to rotate within the interior 18 at a desired rate of rotation during system operation and material deposition.

Referring now to FIGS. 4 to 8, the improved sputtering cathode assembly of the present invention is there shown generally at numeral 20 and includes a replaceable target 52 having a thickness of ½" and formed of elongated flat deposition material such as pure aluminum or other sputter materials. A notched upper perimeter 54 is provided to receive target clamps 48 to hold the target 52 atop a top plate 56 of a two-part cathode body which also includes a cathode body base plate 76.

The top plate 56 is formed of solid copper material and has a thinner central portion 58 ⅛" thick and enlarged perimeter edges 60 which are substantially thicker (½") than the central portion 58. The top plate 56 and the cathode body base plate 76 are held together in sealed fashion by the O-ring therebetween shown in FIG. 8 by spaced threaded fasteners 147 engaged into aligned female threads 78.

Figure 17:
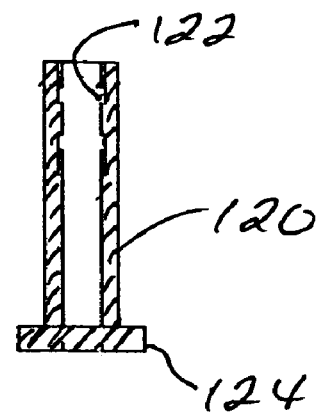
FIG. 17 is a longitudinal section view of the new drop-in insert for target clamping.
Figure 18:
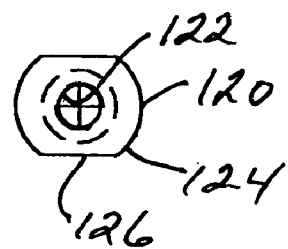
FIG. 18 is an end plan view of FIG. 17.

The target 52 is held securely against the outer surface of the top plate 56 by target clamps 48 which engage over the notched margin 54 of the target 52 and are held in place by threaded fasteners 146 slidably fit through champhered holes 106. This aspect of the invention presents a substantial improvement in reducing the cost of refurbishing of cathode assemblies 20 generally. These threaded fasteners 146 threadably engage into female threads 122 the drop-in inserts 120 as best also seen in FIGS. 17 and 18. One end 124 of these inserts 120 is enlarged forming a thin head having anti-rotation flats 126 machined on opposite sides so as to engage against the machined slot formed into one edge margin of the cathode body base plate 76 at 80. As seen in FIGS. 5, 6, 7 and 8, an elongated retention strip 142 is held against the enlarged ends 124 by threaded fasteners 144 for assembly convenience. Because there is no water sealing requirement of the target 52 against the top plate 56, the tightening or clamping requirement of this arrangement is reduced and as noted in the Background, previously threaded structure formed into the edge of the cathode body base plate or HELICOILS inserted therein have been eliminated altogether so that the threaded engagement is only established between the easily replaceable drop in insert 120 and the threaded fastener 146.

Figure 5:
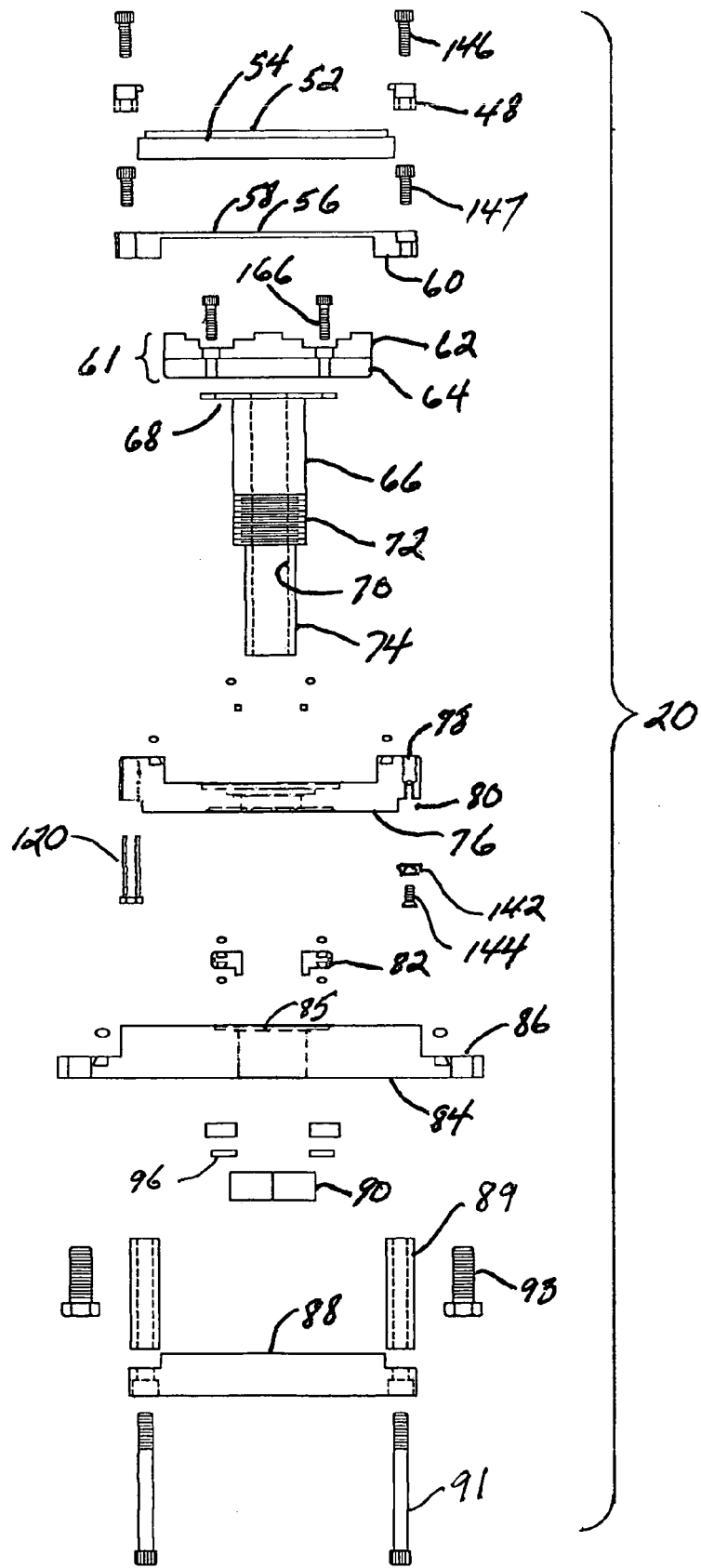
FIG. 5 is an exploded end elevation view of the cathode assembly of FIG. 4.
Figure 8:
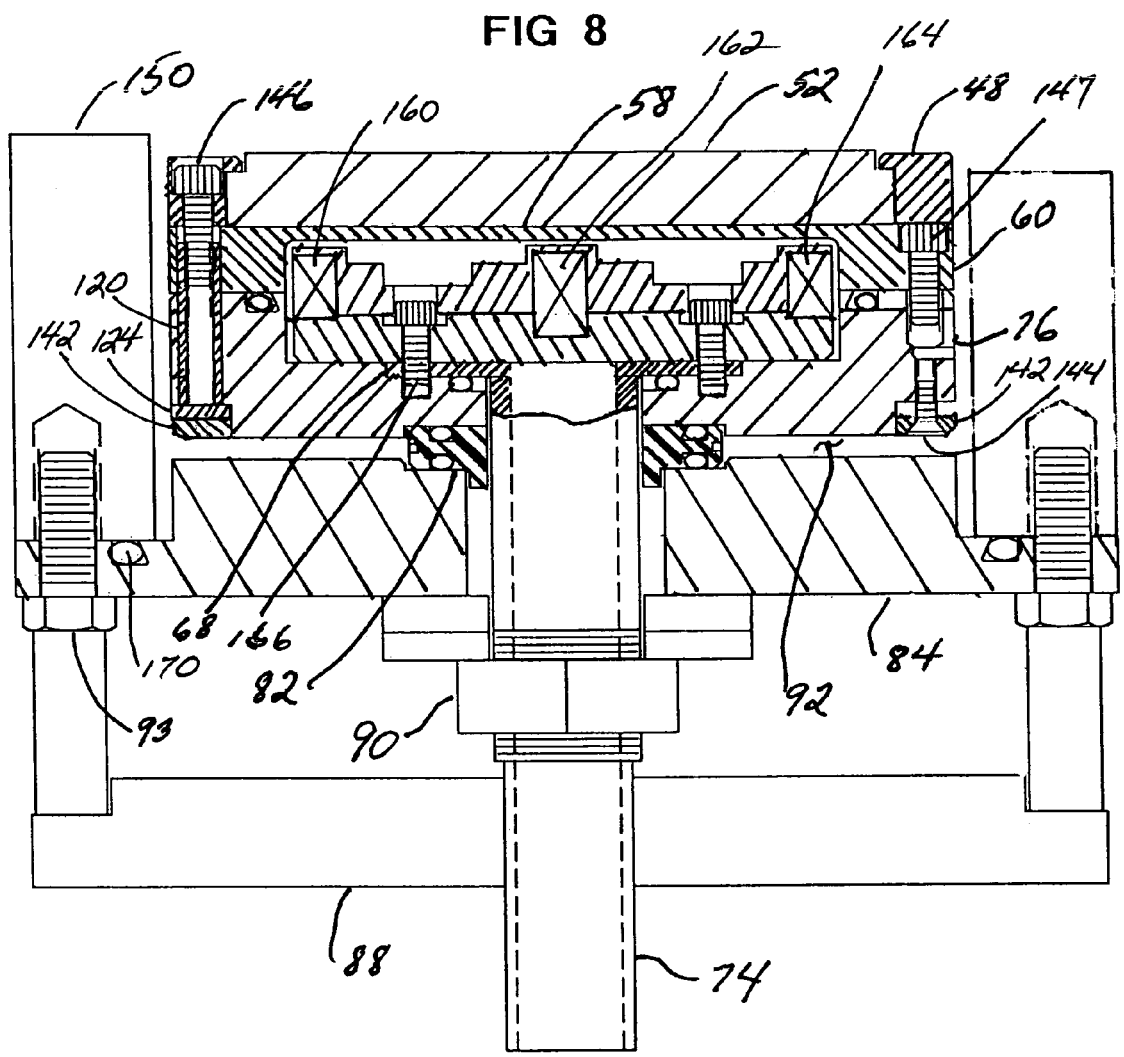
FIG. 8 is an enlarged cross section view of the invention shown in FIG. 6.

Housed within the cavity defined between the top plate 56 and the cathode body base plate 76 is the magnet module 61 seen best in FIG. 5 which includes a cooling channel plate 62 preferably machined of brass and magnet module base 64 preferably formed of stainless steel. This cooling plate channel 62 and magnet module base 64 are held together by threaded fasteners 168 seen in FIG. 19. The magnet module 61 also includes elongated lengths of rare earth permanent magnet material 160, 162 and 164 which are available commercially. These magnets 160, 162 and 164 are positioned to be held as shown between the cooling channel plate 62 and magnet module base 64 as best seen in FIG. 8.

The exposed surface of the cooling channel plate 62 as best also seen in FIGS. 19 and 20, again formed of preferably brass material, includes two parallel generally coextensive water channels 152 and 154 which receive water flowing in the direction of the arrows from the water inlet 94 toward and out through the water outlet 94a. Turbulence steps 156, 158 typical on each side of the raised central portion of each water channel 152 and 154 serve to disrupt laminar flow of water so as to enhance the cooling effect of water passing therethrough. The other side of the water passageway 152 and 154 is defined by the facing surface of the central portion 58 of the top plate 56. The cooling channel plate 62 and the magnet module base 64 are held together by fasteners 168 seen in FIG. 19 while the entire magnet module 61 is held in place against the cathode body plate 76 by threaded fasteners 166. By this arrangement, the target 52 may be removed and serviced or replaced without disrupting the sealed relationship between the top plate 56 and the cathode body plate 76 and the intact magnet module 61.

Figure 7:
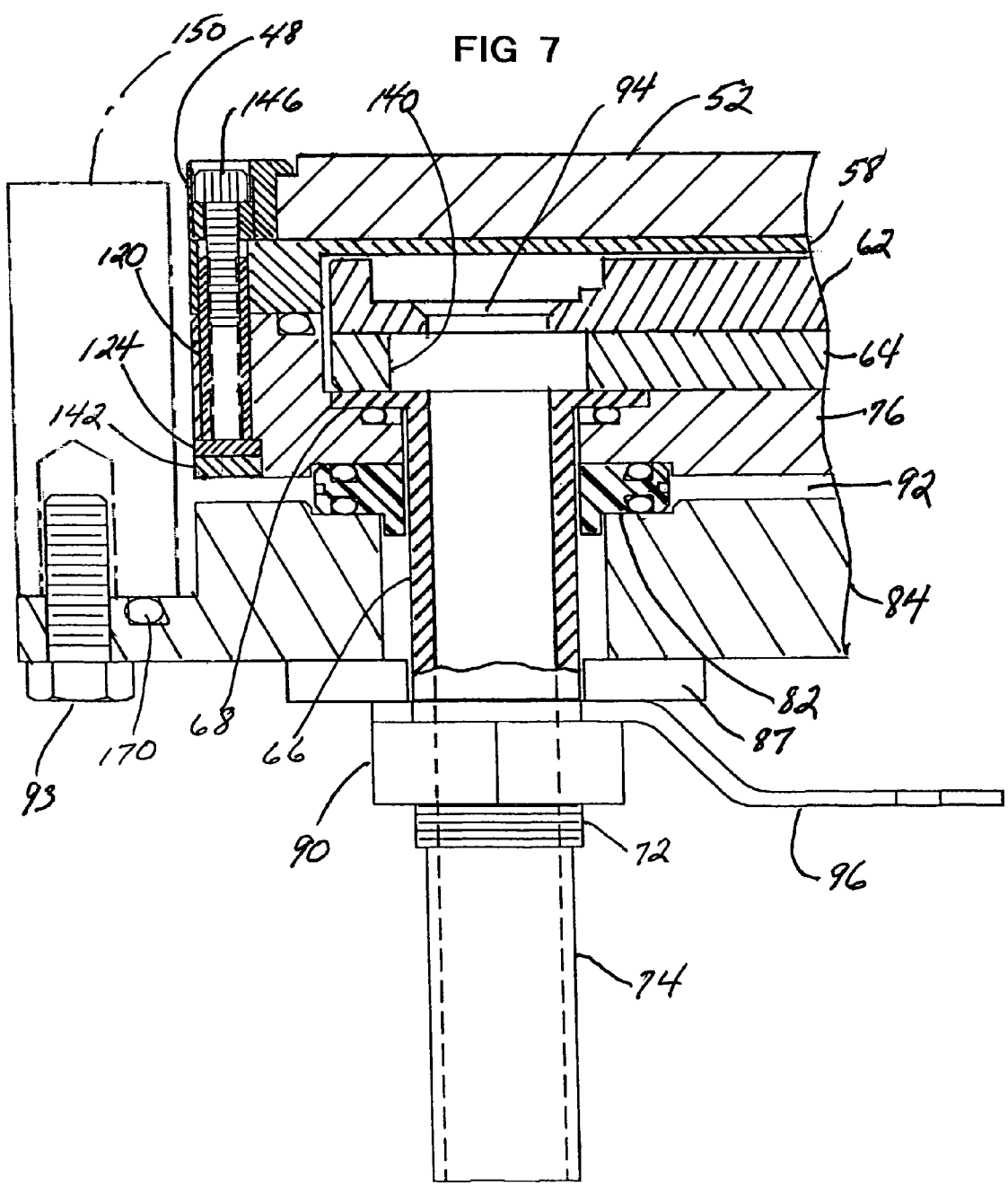
FIG. 7 is an enlarged longitudinal section view of one end of FIG. 6.
Figure 16:
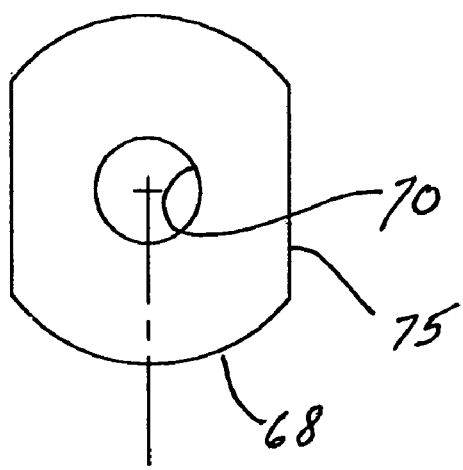
FIG. 16 is an end view of FIG. 15.
Figure 15:
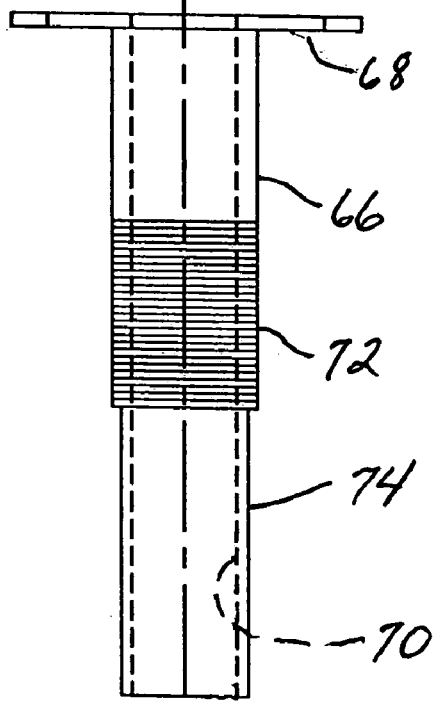
FIG. 15 is an elevation view of the new water inlet/outlet fitting of FIG. 6.

An improved water inlet and outlet fitting is also provided at 66 as best seen in FIGS. 15 and 16, and includes an elongated inner tubular passageway 70 defined by a main threaded section 72 and a smaller in diameter distal tubular section 74. An enlarged flange 68 having alignment flats 75 is provided for mounting the fitting 66. The flange 68 as best seen in FIG. 7 is positioned in alignment and registry with the water inlet 94 (and with the water outlet 94a at the opposite end of the magnet module 61). The flange 68 is entrapped within a mating cavity formed into the cathode body base plate 76 and sealingly engaged against the O-ring as shown in FIG. 7. Thus, no fasteners are required to retain the fitting 66 in the operative position there shown. Note that the water aperture 140 formed into the magnet module base 64 is enlarged over the size of the inlet 94 so as to create additional water turbulence for enhanced heat transfer between the turbulent water flow and the heated cooling channel plate 62 and top plate 56.

Referring now to FIGS. 10 to 14, another important improvement of the present invention is there shown. In commercially available prior art systems, the target, despite being clamped in place by closely spaced highly tightened fasteners connected through the target clamps, will expand in length due to extreme temperatures experienced during the vapor deposition cycle. As Murphy's Law would have it, one end or the other is slightly more tightly clamped so that the thermal expansion will typically occur in only one direction or from one end of the target toward the opposite end. This means that the prior art targets will expand in only one direction and will push sufficiently against the fasteners and target clamps at the opposite end so as to potentially distort or even snap the fasteners completely off due to the power of the expansion forces generated within the target.

Figure 12:
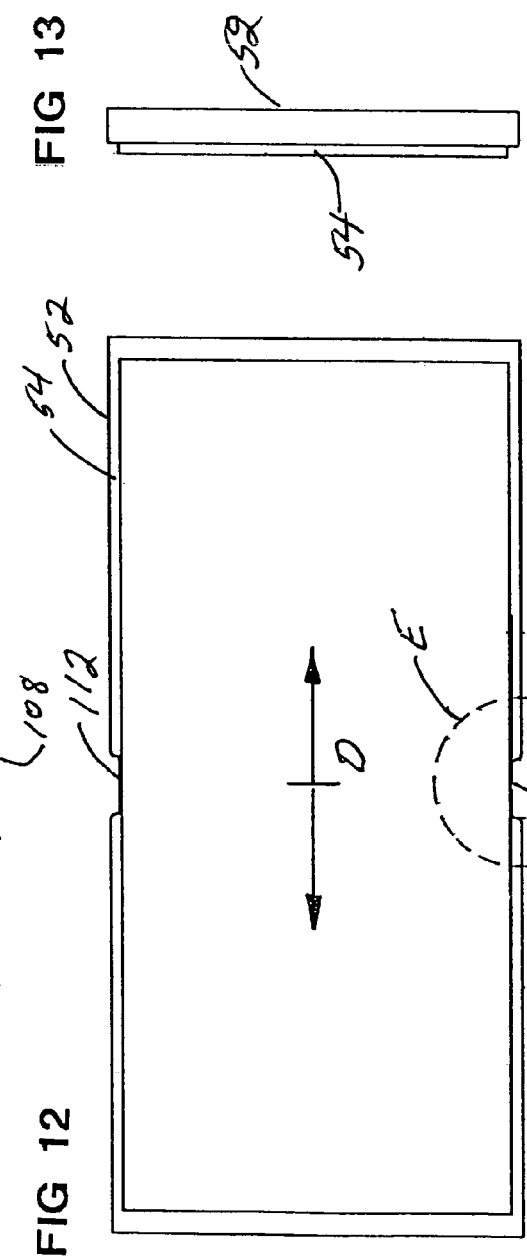
FIG. 12 is a top plan view of the new target of FIG. 6.
Figure 14:
FIG. 14 is an enlarged view of area E of FIG. 12.

To avoid this potential damaging effect of the linear thermal expansion of the improved target 52, notches 112 are formed at the center point of each side margin of the target 52 as seen in FIGS. 12 and 14. These notches 112 closely matably engage with tabs 108 formed into the locking flange of the target clamps 48 while side margin 54 matably engages with edge groove 110. By this arrangement, when fully clamped in place, the notches 112 are held stationary by tabs 108 so that thermal expansion occurs in either direction D about the transverse center of the target 52 which has been shown to eliminate any fastener distortion or fracture at the ends of the target 52.

The entire cathode assembly 20 in one aspect also may be described as including a cathode mounting plate 84 which is generally coextensive therewith. However, this cathode mounting plate 84 must remain electrically isolated from the cathode body and its cathode body base plate 76. This is accomplished by a NYLON, TEFLON or DELRON annular or ring-shaped seal 82 associated with each fitting 66 and which is of sufficient thickness, when positioned within aperture 85, so as to electrically space and create a gap 92 between the cathode body base plate 76 and the cathode mounting plate 84. To retain this arrangement, jamb nut 90 is threadably engaged onto threads 72 of fitting 66. A backing plate 87, also formed of nonmetallic material such as TEFLON or DELRON is positioned against a power connector 96 attachable to a source of electrical power. The jamb nuts 90 threadably engaged onto external threads 72 of water fittings 66 at each end of the cathode assembly 20 provide the only means for securement between the cathode mounting plate 84 and the cathode body base plate 76.

To attach the cathode assembly 20 into operative position within the vacuum chamber 12 as previously described in FIGS. 1 to 3, a cathode-mounting flange or frame 150 as best seen in FIGS. 7 and 8 is also provided. The threaded fastener engagement between apertures 86 and threaded fastener 93 is provided for this purpose and the interface between the cathode mounting plate 84 and the cathode mounting flange 150 is sealed by o-ring 170.

Figure 6:
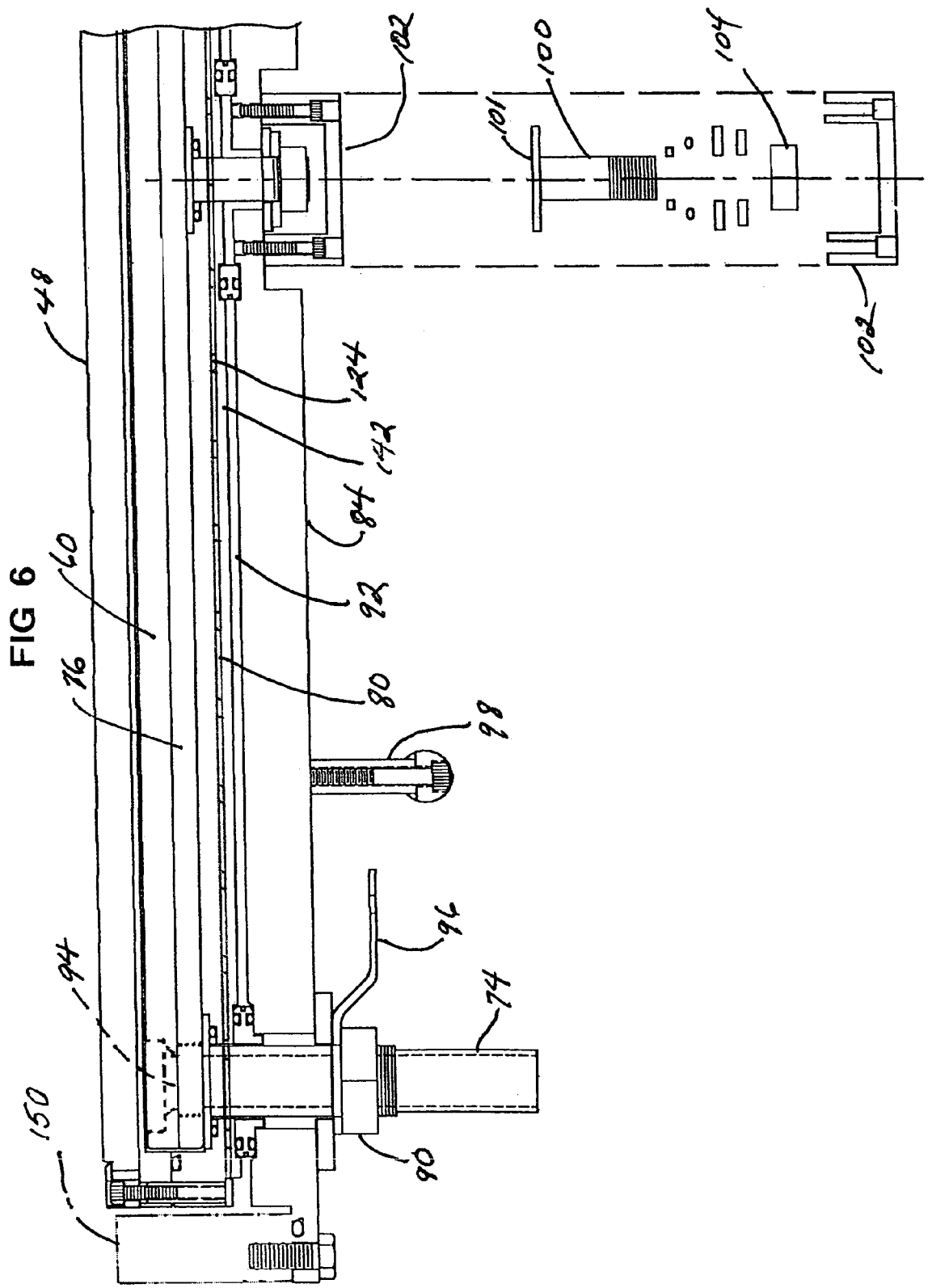
FIG. 6 is a side elevation view of a portion of the cathode assembly in partially exploded view.
Figure 9:
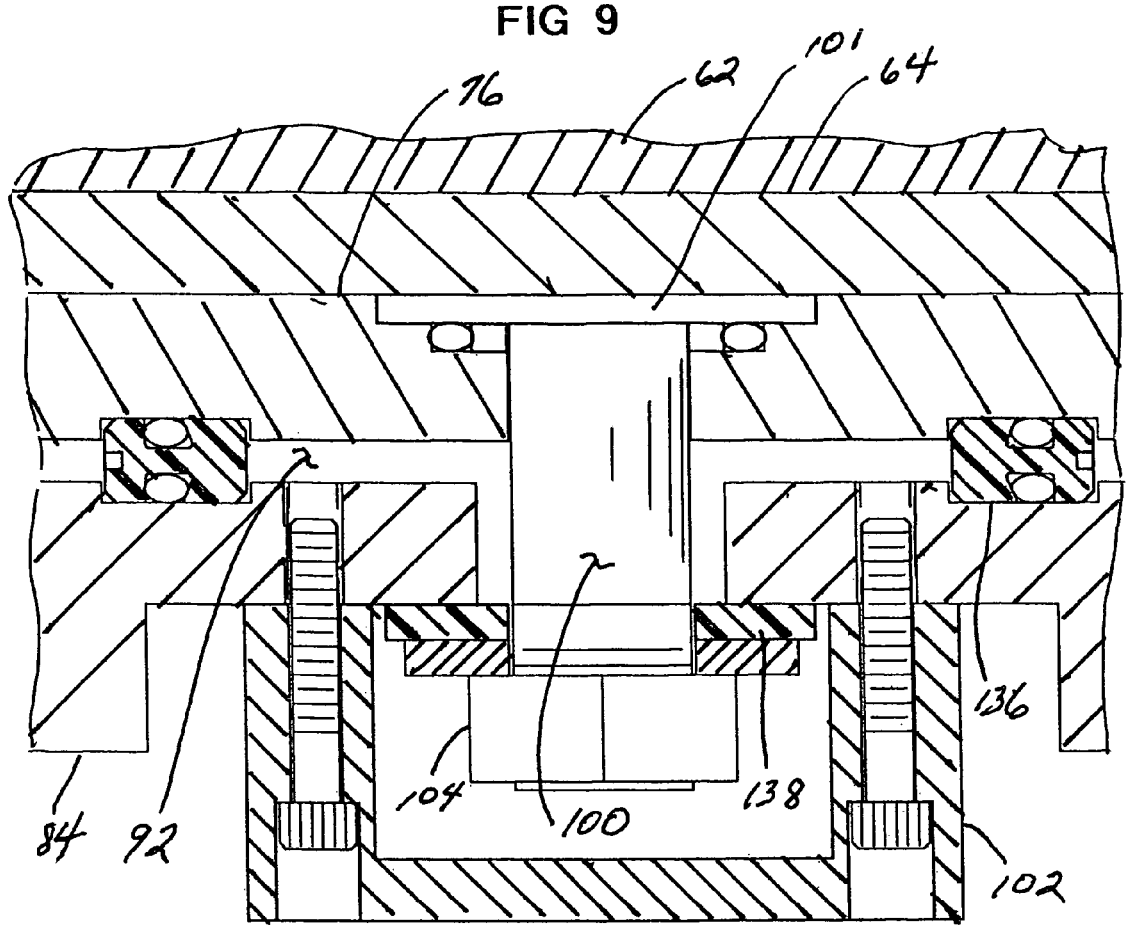
FIG. 9 is an enlarged longitudinal section view of the center portion of the invention as shown in FIG. 6.
Figure 10:
FIG. 10 is a top plan view of the new target clamp.
Figure 11:
FIG. 11 is an enlarged view of area C in FIG. 10.
Figure 13:
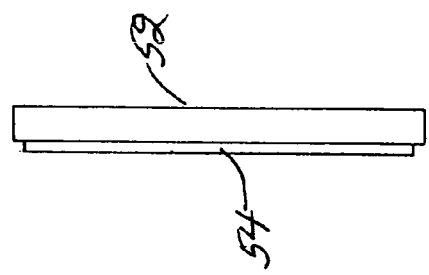
FIG. 13 is an end elevation view of FIG. 12.

Referring now to FIGS. 6 and 9, because of the great potential for distorting the target 52 during the extreme temperature duty cycle it must endure, a central strengthening fitting 100 is also provided. This strengthening fitting 100 includes an enlarged flange 101 which is trapingly engaged and held in sealed fashion by the O-ring shown between the magnet module base 64 and the cathode body base plate 76. An annular nonmetallic non-conductive isolator disk 136 sealingly engaged by O-rings as shown in FIG. 9 is also provided to maintain the electrical gap 92 between the cathode mounting plate 84 and the cathode body base plate 76. A mounting bracket 102 is held in position by threaded fasteners into a mating cavity and threaded apertures formed into the central portion of the cathode mounting plate 84 as seen in FIG. 9 while a jamb nut 104 is threadably engaged onto the distal end of the fitting 100 with nonconductive spacer washer 138 therebetween as shown.

Because of the extreme weight of the cathode assembly 20, handles 88 are also provided attached to the cathode mounting plate 84 in spaced relation by spacers 89 and fasteners 91 as best seen in FIGS. 5 and 6.

While the instant invention has been shown and described herein in what are conceived to be the most practical and preferred embodiments, it is recognized that departures may be made therefrom within the scope of the invention, which is therefore not to be limited to the details disclosed herein, but is to be afforded the full scope of the claims so as to embrace any and all equivalent apparatus and articles.

The invention claimed is:

1. In a sputtering cathode assembly attachable to a cathode mounting plate for a thin-film vapor deposition chamber including an elongated magnet module including a magnet module base and a cooling channel plate generally coextensive with and sealingly connected together along a mating surface therebetween, spaced apart elongated sputtering magnets positioned between said magnet module base and said cooling channel plate said water channel being in fluid communication with a water inlet and a water outlet, a cathode body generally coextensive with said magnet module and including an elongated cathode base plate positioned against said magnet module base and a top plate positioned against said cooling channel plate, said cathode base plate and said top plate sealingly connected together about a central mating perimeter surface therebetween, said magnet module being positioned within a sealed cavity defined between said cathode base plate and said top plate and defining a water channel between said top plate and said cooling channel plate, the improvement comprising;

an elongated flat substantially rectangular target formed of a sacrificial metal and releasably connectable atop and generally coextensive with said top plate and being securable against said top plate by a target clamp wherein said target is replaceable without disassembly of said cathode body or said magnet module;

said target having a notch formed into a central portion of a side margin thereof, said target clamp having a tab extending inwardly from a central portion thereof in snug matable engagement with said notch wherein cyclic thermal elongation of said target during operation of said cathode assembly in the vapor deposition chamber occurs in either direction from said tab which is immobilized in said notch.

2. A sacrificial cathode target for a sputtering cathode assembly attachable to a cathode mounting plate for a thin-film vapor deposition chamber, said cathode assembly comprising:

an elongated magnet module including a magnet module base and a cooling channel plate generally coextensive with and sealingly connected together along a mating surface therebetween, and further including spaced apart elongated sputtering magnets positioned between said magnet module base and said cooling channel plate;

a cathode body generally coextensive with said magnet module and including an elongated cathode base plate positioned against said magnet module base and a top plate positioned against said cooling channel plate, said cathode base plate and said top plate sealingly connected together about a central mating perimeter surface therebetween, said magnet module being positioned within a sealed cavity defined between said cathode base plate and said top plate and defining a water channel between said top plate and said cooling channel plate;

said cathode target comprising:

an elongated flat target releasably connected atop and generally coextensive with said top plate and being secured against said top plate by a target clamp whereby said target is replaceable without disassembly of said cathode body or said magnet module;

said target having a notch formed into a central portion of a side margin thereof, said target clamp having a tab extending inwardly from a central portion thereof in snug matable engagement with said notch whereby cyclic thermal elongation of said target during operation of said cathode assembly in the vapor deposition chamber occurs in either direction from said tab which is immobilized in said notch.

3. A sacrificial cathode target for a sputtering cathode assembly attachable to a cathode mounting plate for a thin-film vapor deposition chamber, said cathode target comprising:

an elongated flat substantially rectangular target formed of a sacrificial metal and releasably connected atop and generally coextensive with a top plate and being secured against said top plate by a target clamp, the top plate and an elongated generally coextensive cathode base plate sealingly connected together about a central mating perimeter surface therebetween to form a cathode body, a magnet module being positioned within a sealed cavity defined between said cathode base plate and said top plate;

said target having a notch formed into a central portion of a side margin thereof, said target clamp having a tab extending inwardly from a central portion thereof in snug matable engagement with said notch whereby cyclic thermal elongation of said target during operation of said cathode assembly in the vapor deposition chamber occurs in either direction from said tab which is immobilized in said notch.

* * * * *